United States Patent [19]
Williams

[11] 4,170,741
[45] Oct. 9, 1979

[54] HIGH SPEED CMOS SENSE CIRCUIT FOR SEMICONDUCTOR MEMORIES

[75] Inventor: David W. Williams, Catonsville, Md.

[73] Assignee: Westinghouse Electric Corp., Pittsburgh, Pa.

[21] Appl. No.: 885,821

[22] Filed: Mar. 13, 1978

[51] Int. Cl.² .................. H03K 5/20; H03K 3/353; G11C 7/00; G11C 11/40
[52] U.S. Cl. ........................... 307/355; 307/279; 307/362; 307/DIG. 3; 365/184; 365/205; 365/208
[58] Field of Search .............. 307/238, 279, 355, 362, 307/DIG. 3; 365/184, 205, 207, 208

[56] References Cited
U.S. PATENT DOCUMENTS

| | | | |
|---|---|---|---|
| 3,518,635 | 6/1970 | Cole et al. | 307/DIG. 3 X |
| 3,925,804 | 12/1975 | Cricchi et al. | 307/DIG. 3 X |
| 3,938,109 | 2/1976 | Gionis et al. | 307/DIG. 3 X |
| 3,992,704 | 11/1976 | Kantz | 307/DIG. 3 X |
| 4,003,035 | 1/1977 | Hoffman | 307/DIG. 3 X |
| 4,039,861 | 8/1977 | Heller et al. | 307/355 |
| 4,094,008 | 6/1978 | Lockwood | 307/DIG. 3 X |
| 4,114,055 | 9/1978 | Hollingsworth | 307/DIG. 3 X |

OTHER PUBLICATIONS

Aaron, *IBM Technical Disclosure Bulletin*, pp. 1768–1769, vol. 19, No. 5, 10/1976.

*Primary Examiner*—Larry N. Anagnos
*Attorney, Agent, or Firm*—R. M. Trepp

[57] ABSTRACT

A high speed sensing circuit is described incorporating complementary metal oxide semiconductor field effect transistor circuitry for sensing, amplifying and storing a signal indicative of the polarity of the difference voltage across two load elements. The load elements may be a pair of variable threshold transistors.

5 Claims, 2 Drawing Figures

HIGH SPEED CMOS SENSE CIRCUIT FOR SEMICONDUCTOR MEMORIES

GOVERNMENT CONTRACT

The invention herein described was made in the course of or under a contract or subcontract thereunder with the Department of the Air Force.

CROSS-REFERENCE TO A RELATED APPLICATION

This application is cross-referenced to Ser. No. 886,027 filed on Mar. 13, 1978 and now U.S. Patent No. 4,139,911 issued on Feb. 1979 to F. M. Sciulli and D. W. Williams, and assigned to the assignee herein which discloses a memory sense circut for comparing the threshold voltages of a first and second variable threshold transistor.

BACKGROUND OF THE INVENTION

1. Field of the Invention:

This invention relates to semiconductor memory sense circuits particularly to variable threshold transistor memory sense circuits.

2. Description of the Prior Art

A semiconductor memory includes a plurality of memory cells which are normally arranged in an array having rows and columns. A memory cell may contain one or two variable threshold transistors such as a metal nitride oxide semiconductor (MNOS) transistor. Information is written into and read out of the memory array by selecting the row and column pertaining to the desired memory cell with a row decoder and column decoder. To write information into a single transistor memory cell, voltages are placed across the variable threshold transistor to shift the threshold voltage of the transistor to a new threshold voltage such as from $-2$ volts to $-8$ volts. To write information into a memory cell containing two transistors, voltages are placed across each variable threshold transistor to shift the threshold voltage of each transistor to different threshold voltages such as $-2$ volts and $-8$ volts for one information state and $-8$ volts and $-2$ volts for the other. The threshold voltage of the transistor or pair of transistors is read out by placing a predetermined voltage on the selected row of the memory cell which is coupled to the gates of the variable threshold transistors in the row. The voltage is normally selected to cause the variable threshold transistor to turn on or source follow if its threshold voltage is $-2$ volts and to remain off or to conduct a very small amount of current, in the range of microamperes, if the threshold voltage is at $-8$ volts. In the prior art, the current passing through the variable threshold transistor between the source and drain electrodes is detected or sensed by comparing it with the current passing through a reference load or through another variable threshold transistor which has a predetermined threshold voltage. The sense circuit normally used to compare the conductivities of two load elements is a cross-coupled latch which is initially set so that neither transistor in the latch conducts current. For example, a cross-coupled latch consisting of two P-channel enhancement mode, field effect transistors initially has its source, drain and gate electrodes charged to the same voltage. At the appropriate time for sensing, the gate of the first transistor and the drain of the second transistor are coupled to one load element of the gate of the second transistor and the drain of the first are coupled to a second load element. As the two load elements conduct current, the gates of the two transistors drop in voltage from their percharge potential. The load element having the greatest conductivity will pull the gate, for example, of the first transistor to a lower potential first resulting in turning on the first transistor. The first transistor supplies current to its drain and the other load element tending to pull the voltage at the other load element and the gate of the second transistor positive, tending to turn the second transistor off. The gate of the first transistor continues to drop in potential while the gate of the second transistor is charged up, causing the cross-coupled pair of field effect transistors to latch into a stable state.

For lower power, the detection latch may comprise a cross-coupled pair of complementary metal oxide semiconductor (CMOS) NOR gates.

When the detection latch is in the stable state, one of the load elements has been charged positive to the positive supply voltage. If the other side of the load element is coupled to the negative voltage supply, then a DC path from the positive to the negative voltage supply may exist if the load element conducts current. Even though the current conducted by the load element may be small, in the range of microamperes, considerable power may be dissipated because of the voltage across the load element such as 30 volts.

With the detection latch in the stable state and with one side of the latch charged to a positive voltage such as $+10$ volts, read enhancement may occur during reading when the gate of the variable threshold transistor (acting as a load element) is negative. Read enhancement is variable threshold transistors occurs when the voltage during reading across the gate and source electrodes is sufficient to shift the threshold voltage, $V_T$, more negative. In fast (1 microsecond write pulses) random access memory (RAM) applications, repeated read cycles could shift the threshold voltage enough so that a subsequent write cycle could not reverse the threshold voltage.

A prior art detection latch comprised of all P-channel transistors is an impedance ratio type circuit in which the voltage divided between the load element and the impedance of the latch transistors is important to assure proper voltages at a time prior to latching. This places constraints on the relative sizes of the transistors in the latch as well as the transistors in the memory array.

It is therefore desirable to provide a sense circuit which will not place a positive voltage on the source of the variable threshold transistor being read which results in read enhancement.

It is further desirable to provide an improved sense circuit which will have low power dissipation.

It is further desirable to provide a sense circuit which is not an impedance ratio type circuit where the voltage is divided between the load element and the transistors of the side of the latch circuit it is coupled to which in turn removes the constraints on the relative sizes of the transistors in the latch and the transistors used in the memory cells.

SUMMARY OF THE INVENTION

In accordance with the present invention, a CMOS memory sense circuit is described for comparing a first and second voltage comprising:

First through tenth field effect transistors each having a gate, source and drain electrode, the first through fourth and the sixth through ninth transistors having a P-type channel, the fifth and tenth transistors having an N-type channel, the source electrode of the first and sixth transistors coupled to the positive terminal of a first voltage supply, the drain electrode of the first transistor coupled to the source electrode of the second transistor, the drain electrode of the second transistor coupled to the source electrode of the third transistor, the drain electrode of the third transistor coupled to the source electrode of the fourth transistor, the drain electrode of the fourth transistor coupled to the drain electrode of the fourth transistor coupled to the drain electrode of the fifth transistor and to the gate electrodes of the seventh and tenth transistors, the source electrodes of the fifth and tenth transistors coupled to the negative terminal of the first voltage supply, the drain electrode of the sixth transistor coupled to the source electrode of the seventh transistor, the drain electrode of the seventh transistor coupled to the source electrode of the eighth transistor, the drain electrode of the eighth transistor coupled to the source electrode of the ninth transistor, the drain electrode of the ninth transistor coupled to the drain electrode of the tenth transistor and to the gate electrodes of the second and fifth transistors, the gate electrode of the third transistor coupled to a means for applying the first voltage, the gate electrode of the eighth transistor coupled to a means for applying the second voltage, first through fourth control signals, first means coupled and responsive to the first control signal for coupling the gate electrodes of the third and eighth transistors to the positive terminal of the first voltage supply, second means coupled and responsive to the second control signal for coupling the source electrode of the third transistor to the gate electrode of the eighth transistor, third means coupled and responsive to the second control signal for coupling the source electrode of the eighth transistor to the gate electrode of the third transistor, the gate electrode of the first, fourth, sixth and ninth transistors coupled to the third control signal for controlling the conduction of the first, fourth, sixth and ninth transistors, and fourth means coupled and responsive to the fourth control signal for coupling the drain electrode of the fourth and ninth transistors to the negative terminal of the first voltage supply.

DESCRIPTION OF THE PREFERRED EMBODIMENTS

Figure 1:
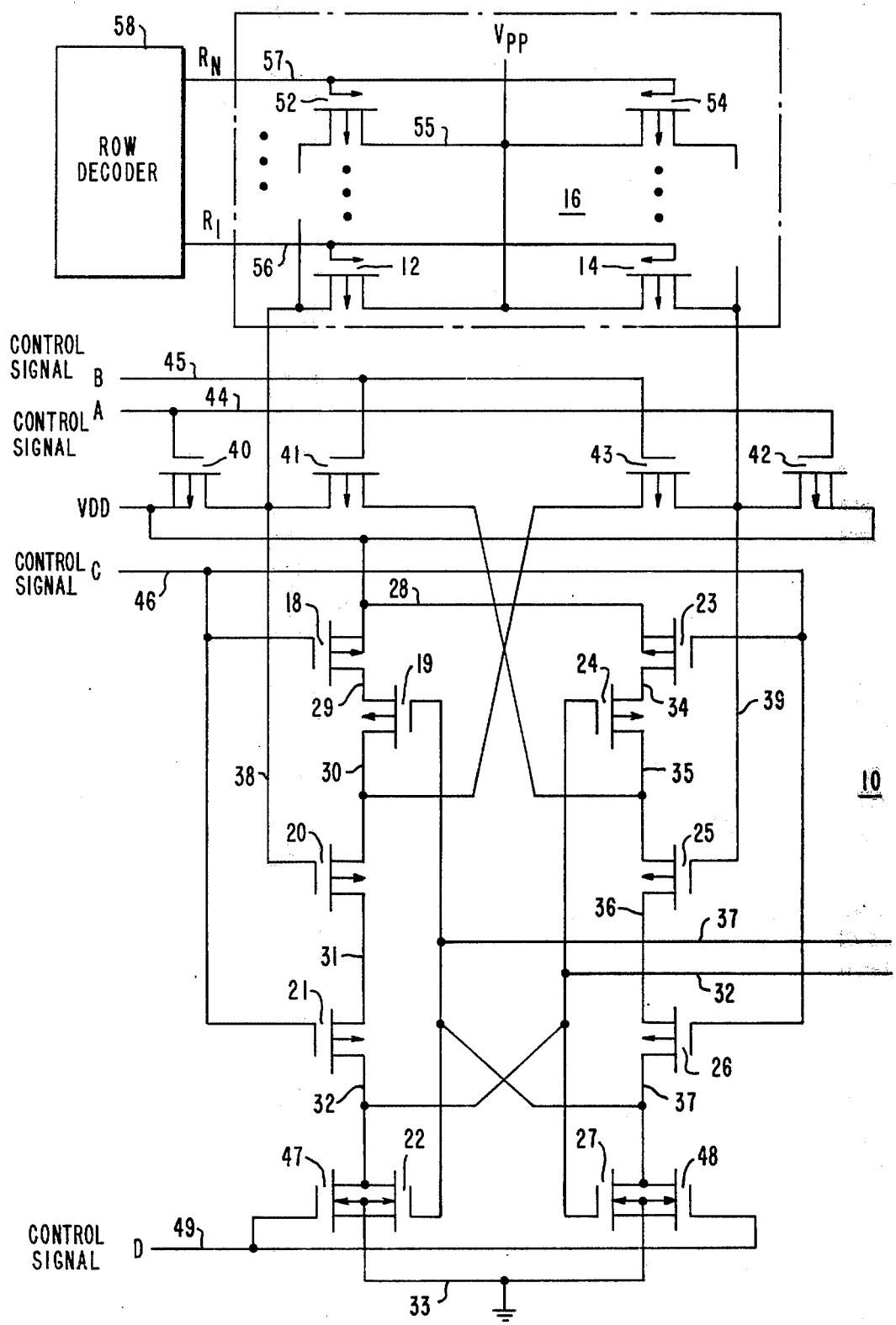
FIG. 1 is a circuit schematic of one embodiment of the invention.

Referring now to the drawings, FIG. 1 shows a circuit schematic of a CMOS memory sense circuit 10 coupled to first and second variable threshold transistors 12 and 14. Variable threshold transistors 12 and 14 each have a source gate and drain electrode and may be, for example, part of memory array 16. Memory sense circuit 10 is comprised of transistors 18 through 27 each having a gate, source and drain electrode. Transistors 18 through 21 and transistors 23 through 26 have a p-type channel. Transistors 22 and 27 have an N-type channel.

The source electrode of transistors 18 and 23 are coupled to the positive terminal of a first voltage supply, $V_{DD}$ over line 28. The drain electrode of transistor 18 is coupled over line 29 to the source electrode of transistor 19. The drain electrode of transistor 19 is coupled over line 30 to the source electrode of transistor 20. The drain electrode of transistor 20 is coupled over line 31 to the source electrode of transistor 21. The drain electrode of transistor 21 is coupled over line 32 to the drain electrode of transistor 22 and to the gate electrode of transistors 24 and 27. The source electrodes of transistors 22 and 27 are coupled over line 33 to the negative terminal of the first voltage supply, $V_{DD}$, which is designated as ground.

The drain electrode of transistor 23 is coupled over line 34 to the source electrode of transistor 24. The drain electrode of transistor 24 is coupled over line 35 to the source electrode of transistor 25. The drain electrode of transistor 25 is coupled over line 36 to the source electrode of transistor 26. The drain electrode of transistor 26 is coupled over line 37 to the drain electrode of transistor 27 and to the gate electrode of transistors 19 and 22.

The gate electrode of transistor 20 is coupled over line 38 to a first voltage which may for example be the source electrode of variable threshold transistor 12. The gate electrode of transistor 25 is coupled over line 39 to a second voltage which may for example be the source electrode of variable threshold transistor 14. The gate of transistor 20 is also coupled over line 38 to the drain electrode of transistors 40 and 41. The gate of transistor 25 is also coupled over line 39 to the drain electrode of transistors 42 and 43. The gate of transistors 40 and 42 are coupled over line 44 to control signal A. The source electrode of transistors 40 and 42 are coupled to first voltage supply $V_{DD}$. Transistors 40 and 42 provide a means which is responsive to control signal A for coupling the gate electrode of transistors 20 and 25 to a positive voltage, $V_{DD}$ to initialize the voltages on the gate electrode of transistors 20 and 25 prior to sensing.

The gate electrode of transistors 41 and 43 are coupled over line 45 to control signal B. The source electrode of transistor 41 is coupled over line 35 to the drain electrode of transistor 24 and the source electrode of transistor 25. The source electrode of transistor 43 is coupled over line 30 to the drain electrode of transistor 19 and the source electrode of transistor 20. Transistors 41 and 43 provide a means which is responsive to control signal B for coupling the source electrode of transistor 20 to the gate electrode of transistor 25 and for coupling the source electrode of transistor 25 to the gate electrode of transistor 20. The gate electrode of transistors 18, 21, 23 and 26 are coupled over line 46 to control signal C for controlling the conduction and non-conduction of transistors 18, 21, 23 and 26.

The drain electrode of transistor 21 is also coupled over line 32 to the drain electrode of transistor 47 which may for example be an N-channel transistor. The drain electrode of transistor 26 is also coupled over line 37 to the drain electrode of transistor 48 which may for example be an N-channel transistor. The gate electrode of transistors 47 and 48 are coupled over line 49 to control signal D. The source electrodes of transistors 47 and 48 are also coupled over line 33 to ground. Transistors 47 and 48 which are responsive to control signal D provide a means for coupling the drain electrode of transistors 21 and 26 to ground potential.

As shown in FIG. 1 memory array 16 includes variable threshold transistors 12, 14, 52 and 54. In memory array 16, transistors 12 and 52 form one column with the drain electrode of transistors 12 and 52 coupled over line 55 to voltage supply $V_{PP}$ which may be, for example, −20 volts. A second column of variable threshold transistors includes transistors 14 and 54. The drain electrode of transistors 14 and 54 in the second column are coupled over line 55 to voltage supply $V_{PP}$. The two columns of variable threshold transistors may be combined to form one column of memory cells where transistors 12 and 14 form one memory cell and transistors 52 and 54 form another memory cell. The gates of transistors 12 and 14 are coupled over line 56 to an output of row decoder 58 which provides a row select signal $R_1$. The gate of transistors 52 and 54 are coupled over line 57 to an output of row decoder 58 which provides a row select signal $R_N$. The source electrodes of transistors 12 and 52 are coupled to line 38. The source electrodes of transistors 14 and 54 are coupled to line 39. The transistor substrate or body connections are handled in accordance with good design practice. One acceptable method is to connect all P channel bodies to the most positive supply ($V_{DD}$) and all the N channel bodies to ground.

Figure 2:
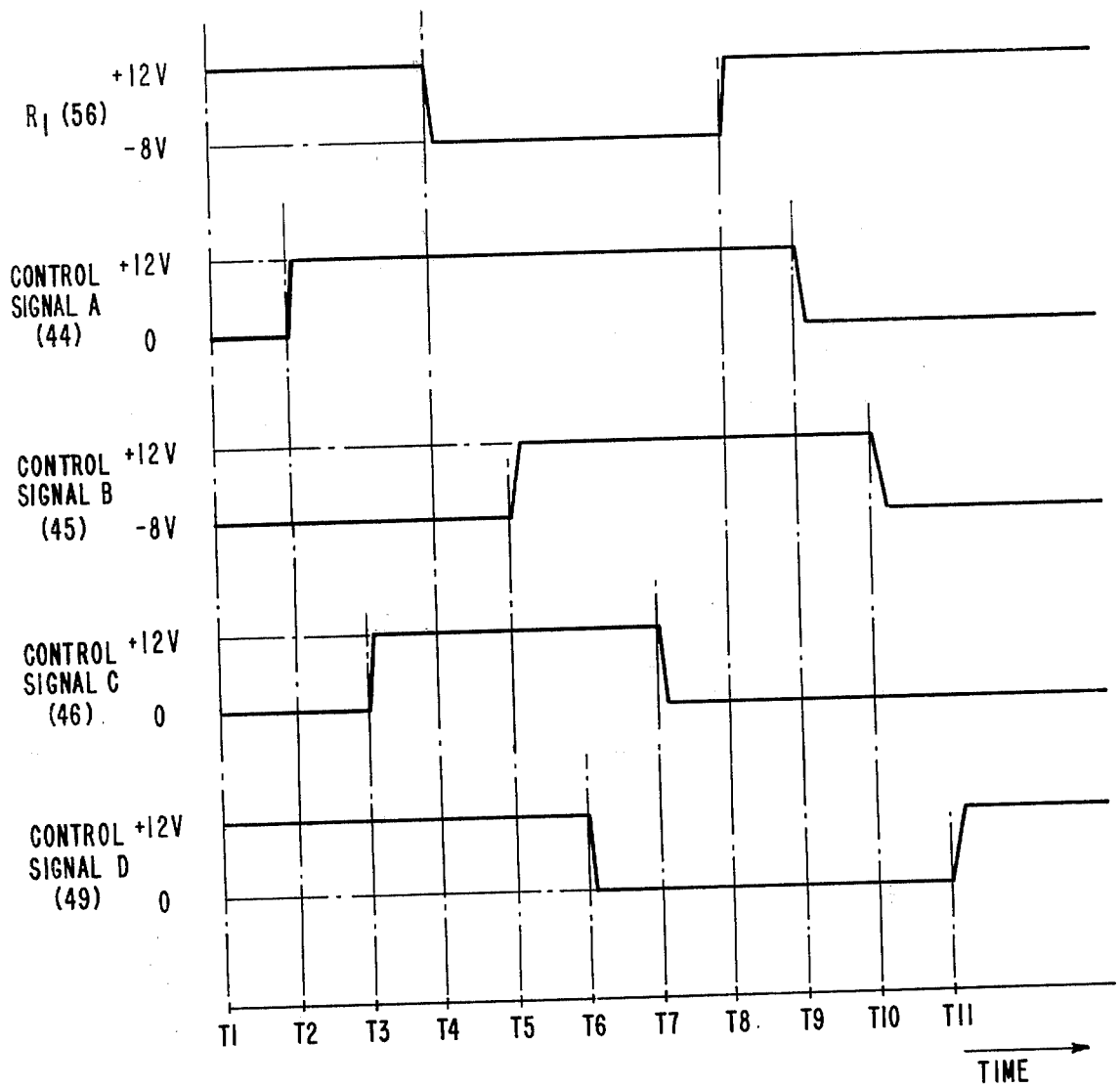
FIG. 2 shows circuit waveforms for the operation of the embodiment of the invention shown in FIG. 1.

FIG. 2 shows circuit waveforms for the operation of the embodiment of the invention shown in FIG. 1. In FIG. 2 the ordinate represents voltage and the abscissa represents time. At time T1 signal $R_1$ on line 56 as well as all other row lines such as $R_N$ on line 57 are at +12 volts which causes the variable threshold transistors 12, 14, 52 and 54 to be non-conducting. At time T1, control signal A is at 0 volts which causes transistors 40 and 42 to be conducting coupling voltage supply, $V_{DD}$ which may for example be at +12 volts to charge lines 38 and 39 to +12 volts. At time T1, control signal B is at −8 volts which causes transistors 41 and 43 to be conducting which couples line 35 to line 38 and couples line 30 to line 39. Line 30 and line 35 are therefore coupled to +12 volts through transistors 43 and 42 and through transistors 41 and 40. At time T1, control signal C is at 0 volts which causes transistors 18, 21, 23 and 26 to be conducting. Transistor 18 is the conducting state charges line 29 up to the voltage of $V_{DD}$. Transistor 23 in the conducting state charges line 34 up to the voltage of $V_{DD}$. Transistor 21 in the conducting state causes line 31 to source follow the gate voltage of 0 volts. Transistor 26 in the conducting state causes line 36 to source follow the gate voltage of 0 volts. At time T1, control signal D is at +12 volts which causes transistors 47 and 48 to be in the conducting state coupling lines 32 and 37 to line 33 which is at ground potential or 0 volts. With line 32 at 0 volts, transistor 24 is in the conducting state. With line 37 at 0 volts, transistor 19 is in the conducting state. Transistor 24 provides a second path through transistor 23 for charging line 35 to the voltage of $V_{DD}$. Transistor 19 along with transistor 18 provides a second path for charging line 30 to the voltage of $V_{DD}$. With line 37 at 0 volts transistor 22 is in the non-conducting state and with line 32 at 0 volts transistor 27 is in the non-conducting state.

At time T1 the gate and source of the memory transistors 12, 14, 52 and 54 are at the voltage $V_{DD}$ or 12 volts. The gate and source of the sense transistors 20 and 25 are at the voltage of $V_{DD}$ or 12 volts. The drain electrode of transistors 20 and 25 are at 0 volts or slightly more positive depending on the threshold voltage of the transistors, and the drain electrode of the N channel devices, transistors 22, 27, 47 and 48 are at 0 volts. At time T1, memory sense circuit 10 is reset or initialized for the operation of comparing a first and second voltage on lines 38 and 39.

At time T2 control signal A on line 44 goes from 0 to +12 volts transistors 40 and 42 to be non-conducting which decouples lines 38 and 39 from the voltage, $V_{DD}$. At time T3 control signal C on line 46 goes from 0 to +12 volts which causes transistors 18, 21, 23 and 26 to be non-conducting.

At time T4 signal $R_1$ on line 56 goes from +12 volts to −8 volts causing variable threshold transistors 12 and 14 to be conducting. Signal $R_N$ on line 57 remains high causing variable threshold transistors 52 and 54 to remain in the non-conducting state. With variable threshold transistors 12 and 14 conducting line 38 and the gate of transistor 20 is discharged or pulled low and line 39 and the gate of transistor 25 is discharged or pulled low from +12 volts. Control signal B on line 45 remains at −8 volts keeping transistor 43 conducting and allowing the source of transistor 20 to go to the voltage on line 39 and the gate of transistor 25. With transistor 41 conducting, the source of transistor 25 is also allowed to go to the voltage of line 38 and the gate of transistor 20. The voltage of control signal B should be sufficiently negative to allow the sources of transistors 20 and 25 to follow the voltage of the source electrodes of variable threshold transistors 12 and 14 completely from time T4 to time T5. Assuming the threshold voltage, $V_T$ of variable threshold transistor 12, is $V_{TML}$; and the threshold voltage $V_T$ of variable threshold transistor 14 is $V_{TMH}$, then the gate of transistor 20 will discharge to the voltage of $V_{R1}-V_{TMH}$ where $V_{R1}$ is the voltage of $R_1$ such as −8 volts. The gate of transistor 25 will charge to the voltage of $V_{R1}-V_{TML}$. The gate to source voltage of transistor 20 is described below in equation 1.

$$V_{gs20}=(V_R-V_{TML})-(V_R-V_{TMH})=V_{TMH}-V_{TML}=\Delta V_T \qquad (1)$$

The gate to source voltage of transistor 25 is described below in equation 2.

$$V_{gs25}=(V_R-V_{TMH})-(V_R-V_{TML})=V_{TML}-V_{TMH}=-\Delta V_T \qquad (2)$$

The latch or cross-coupled pair of transistors including transistors 20 and 25 has a voltage difference between the gate source voltage of the two transistors of $V_{gs20}-V_{gs25}$ and is further described in equation 3.

$$V_{gs20}-V_{gs25}=(\Delta V_T)-(-\Delta V_T)=2\Delta V_T \qquad (3)$$

Note that the voltage difference across the transistors is double the voltage difference on lines 38 and 39. The voltage doubling across transistors 20 and 25 increases the sensitivity of the CMOS memory sense circuit to enable sensing of a first and second voltage having a smaller voltage difference.

At time T5, control signal B on line 45 goes from −8 volts to +12 volts which turns off transistors 41 and 43 to the non-conducting state. At time T6, control signal D on line 49 goes from +12 volts to 0 volts which turns off transistors 47 and 48 to the non-conducting state. At time T7, control signal C on line 46 goes from +12 volts to 0 volts which turns on transistors 18, 21, 23 and 26 to the conducting state. During times T5 through T8 signal R1 on line 56 and control signal A on line 44 remain unchanged.

When control signal C goes low at time T7, current flows through transistors 18, 19, 20 and 21 tending to pull line 32 towards the voltage of voltage supply $V_{DD}$.

At the same time current from voltage supply $V_{DD}$ also flows through transistors 23, 24, 25 and 26 tending to pull line 37 to the voltage of the voltage supply $V_{DD}$. If the gate to source voltage on transistor 25 is initially $-\Delta V_T$, as shown in equation 2, then transistor 25 will tend to conduct more current at an earlier time than transistor 20 which has a gate to source voltage of $+\Delta V_T$ as shown in equation 1. If more current passes through transistor 25 than transistor 20, then line 37 will be charged or pulled towards the voltage $V_{DD}$ ahead of the voltage on line 32 which is also charged or pulled towards the voltage of $V_{DD}$ but behind line 37 due to the larger current passing through transitor 25. As line 37 goes positive, transistor 22 is turned on or to the conducting state which tends to discharge line 32 towards ground. As line 37 goes positive towards the voltage of $V_{DD}$, transistor 19 is turned off, preventing any further current to flow through transistor 20 and preventing line 32 from being charged to voltage supply $V_{DD}$. Thus, the CMOS memory sense circuit is latched with line 32 being clamped to ground through transistor 22 and line 37 being clamped to a positive voltage close to the voltage of voltage supply $V_{DD}$ by current passing through transistors 23, 24, 25 and 26. At this time the output of the CMOS memory sense circuit is valid on lines 32 and 37 with one line representing the true data and the other representing the complement of the true data.

For maximum sensitivity of the CMOS memory sense circuit between time T7 and T8 prior to when the circuit latches, the transconductance of transistors 20 and 25 should be smaller or lower than the other P-channel transistors in the sense circuit, transistors 18, 19, 21, 23, 24 and 26, so that transistors 20 and 25 do most of the current limiting prior to reaching a stable condition. The transconductance of a transistor, $g_M$, is defined by equation 4.

$$g_M = (\Delta I_{ds})/(\Delta V_{gs}) \qquad (4)$$

where $\Delta I_{ds}$ is a change in drain source current and $\Delta V_{gs}$ is a change in gate source voltage.

At time T8 signal $R_1$ on line 56 goes from $-8$ volts to $+12$ volts which causes transistors 12 and 14 to be in the non-conducting state.

At time T9, control signal A on line 44 goes from $+12$ volts to 0 volts which turns transistors 40 and 42 on to the conducting state. With transistors 40 and 42 conducting, lines 38 and 39 are charged to the voltage of $V_{DD}$ or $+12$ volts. The voltage across the variable threshold transistors 12 and 14 between the gate and source electrode is 0 volts. With the voltage on line 38 and line 39 at 12 volts, transistors 20 and 25 are non-conducting.

At time T10, control signal B on line 45 goes from $+12$ volts to $-8$ volts, causing transistors 41 and 43 to be in the conducting state. At time T11, control signal D on line 49 goes from 0 volts to $+12$ volts, causing transistors 47 and 48 to be conducting, discharging lines 32 and 37 to the ground potential. At time T11 memory sense circuit 10 and control signals A through D are in the same condition as at time T1. Thus, from time T1 through T11 one memory sense circuit cycle has been completed.

A CMOS memory sense circuit for comparing a first and second voltage is described utilizing first through tenth field effect transistors, each having a gate, source and drain electrode, the first through fourth and the sixth through ninth transistors having a P-type channel, the fifth and tenth transistors having an N-type channel, the source electrode of the first and sixth transistors coupled to the positive terminal of a first voltage supply, the drain electrode of the first transistor coupled to the source electrode of the second transistor, the drain electrode of the second transistor coupled to the source electrode of the third transistor, the drain electrode of the third transistor coupled to the source electrode of the fourth transistor, the drain electrode of the fourth transistor coupled to the drain electrode of the fifth transistor and to the gate electrode of the seventh and tenth transistors, the source electrode of the fifth and tenth transistors coupled to the negative terminal of the first voltage supply, the drain electrode of the sixth transistor coupled to the source electrode of the seventh transistor, the drain electrode of the seventh transistor coupled to the source electrode of the eighth transistor, the drain electrode of the eighth transistor coupled to the source electrode of the ninth transistor, the drain electrode of the ninth transistor coupled to the drain electrode of the tenth transistor and to the gate electrode of the second and fifth transistors, the gate electrode of the third transistor coupled to a means for applying the first voltage, the gate electrode of the eighth transistor coupled to a means for applying the second voltage, first through fourth control signals, first means coupled and responsive to the first control signal for coupling the gate electrode of the third and eighth transistors to the positive terminal of the first voltage supply, second means coupled and responsive to the second control signal for coupling the source electrode of the third transistor to the gate electrode of the eighth transistor, third means coupled and responsive to the second control signal for coupling the source electrode of the eighth transistor to the gate electrode of the third transistor, the gate electrode of the first, fourth, sixth and ninth transistors coupled to the third control signal for controlling the conduction of the first, fourth, sixth and ninth transistors, and fourth means coupled and responsive to the fourth control signal for coupling the drain electrode of the fourth and ninth transistors to the negative terminal of the first voltage supply.

I claim:

1. A CMOS memory sense circuit for comparing a first and second voltage comprising:
  first through tenth field effect transistors each having a gate, source and drain electrode,
  said first through fourth and said sixth through ninth transistors having a P-type channel,
  said fifth and tenth transistors having an N-type channel,
  the source electrode of said first and sixth transistors coupled to the positive terminal of a first voltage supply,
  the drain electrode of said first transistor coupled to the source electrode of said second transistor,
  the drain electrode of said second transistor coupled to the source electrode of said third transistor,
  the drain electrode of said third transistor coupled to the source electrode of said fourth transistor,
  the drain electrode of said fourth transistor coupled to the drain electrode of said fifth transistor and to the gate electrode of said seventh and tenth transistors,
  the source electrode of said fifth and tenth transistors coupled to the negative terminal of said first voltage supply, the drain electrode of said sixth transistor coupled to the source electrode of said seventh transistor, the drain electrode of said seventh transistor coupled to the source electrode of said eighth transistor, the drain electrode of said eighth transistor coupled to the source electrode of said ninth transistor, the drain electrode of said ninth transistor coupled to the drain electrode of said tenth transistor and to the gate electrode of said second and fifth transistors, the gate electrode of said third transistor coupled to a means for applying said first voltage, the gate electrode of said eighth transistor coupled to a means for applying said second voltage, first through fourth control signals, first means coupled and responsive to said first control signal for coupling the gate electrode of said third and eighth transistors to said positive terminal of said first voltage supply, second means coupled and responsive to said second control signal for coupling the source electrode of said third transistor to the gate electrode of said eighth transistor, third means coupled and responsive to said second control signal for coupling the source electrode of said eighth transistor to the gate electrode of said third transistor, the gate electrode of said first, fourth, sixth and ninth transistors coupled to said third control signal for controlling the conduction of said first, fourth, sixth and ninth transistors, and fourth means coupled and responsive to said fourth control signal for coupling the drain electrode of said fourth and ninth transistors to the negative terminal of said first voltage supply.

2. The CMOS memory sense circuit of claim 1 wherein said first means includes two field effect transistors.

3. The CMOS memory sense circuit of claim 1 wherein said second means includes a field effect transistor.

4. The CMOS memory sense circuit of claim 1 wherein said third means includes a field effect transistor.

5. The CMOS memory sense circuit of claim 1 wherein said fourth means includes two field effect transistors.

* * * * *